United States Patent
Tanaka

(10) Patent No.: US 6,693,284 B2
(45) Date of Patent: Feb. 17, 2004

(54) STAGE APPARATUS PROVIDING MULTIPLE DEGREES OF FREEDOM OF MOVEMENT WHILE EXHIBITING REDUCED MAGNETIC DISTURBANCE OF A CHARGED PARTICLE BEAM

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/971,506

(22) Filed: Oct. 4, 2001

(65) Prior Publication Data

US 2002/0039179 A1 Apr. 4, 2002

(30) Foreign Application Priority Data

Oct. 4, 2000 (JP) ........................................ 2000-304543
Nov. 27, 2000 (JP) ........................................ 2000-358860

(51) Int. Cl.⁷ ............................ G21K 5/10; G01B 11/00
(52) U.S. Cl. ............................... 250/442.11; 250/492.2; 356/401
(58) Field of Search .................... 250/442.11, 442.1, 250/492.2; 356/401; 310/12, 53; 451/14; 73/105, 504.2

(56) References Cited

U.S. PATENT DOCUMENTS

| | | | | |
|---|---|---|---|---|
| 4,891,526 A | * | 1/1990 | Reeds ................... 250/442.11 |
| 4,916,340 A | * | 4/1990 | Negishi ........................ 310/12 |
| 5,623,853 A | * | 4/1997 | Novak et al. ............. 74/490.09 |
| 5,672,816 A | * | 9/1997 | Park et al. ..................... 73/105 |
| 5,806,193 A | * | 9/1998 | Ebihara ........................ 33/1 M |
| 6,044,705 A | * | 4/2000 | Neukermans et al. .... 73/504.02 |
| 6,144,118 A | * | 11/2000 | Cahill et al. .................. 310/12 |
| 6,262,794 B1 | * | 7/2001 | Miyajima ..................... 355/53 |
| 6,359,688 B2 | * | 3/2002 | Akimoto et al. ............. 356/401 |
| 6,437,463 B1 | * | 8/2002 | Hazelton et al. .............. 310/12 |
| 6,466,324 B1 | * | 10/2002 | Doran ........................ 356/500 |
| 6,484,602 B1 | * | 11/2002 | Dagalakis et al. ........ 74/490.08 |
| 6,561,871 B1 | * | 5/2003 | Sommer ....................... 451/14 |

FOREIGN PATENT DOCUMENTS

JP 62-182692 8/1987

* cited by examiner

Primary Examiner—John R. Lee
Assistant Examiner—Mary El-Shammaa
(74) Attorney, Agent, or Firm—Klarquist Sparkman, LLP

(57) ABSTRACT

Stage apparatus are disclosed that include a table that can be driven with multiple degrees of freedom without disturbing any neighboring magnetic fields. Hence, such stage apparatus can be used in charged-particle-beam microlithography apparatus without compromising accuracy and precision of a lithography process being conducted on the substrate by the charged particle beam. From downstream to upstream, a representative stage assembly comprises a first ("lower") stage driven by a respective linear motor along the Y-axis, a frame that can be rotated by a piezo actuator in the $\theta_Z$ direction, a second (upper) stage driven by a respective linear motor along the X-axis, and a table driven by multiple piezo actuators in the $\theta_X$, $\theta_Y$, and Z directions. A wafer table, on which a substrate can be mounted, is attached to the "upper" surface of the table. The stage assembly allows motion of the wafer table with six degrees of freedom.

16 Claims, 6 Drawing Sheets

STAGE APPARATUS PROVIDING MULTIPLE DEGREES OF FREEDOM OF MOVEMENT WHILE EXHIBITING REDUCED MAGNETIC DISTURBANCE OF A CHARGED PARTICLE BEAM

FIELD

This disclosure pertains to microlithography (pattern transfer) performed using a charged particle beam (e.g., electron beam or ion beam). Microlithography is a key technique used in the manufacture of microelectronic devices such as integrated circuits, displays, thin-film magnetic heads, and micromachines. More specifically, this disclosure pertains to stage apparatus that provide highly accurate and precise movement and positioning of, e.g., a reticle or substrate as used in a charged-particle-beam (CPB) microlithography apparatus. The stage apparatus also provide multiple degrees of freedom of stage movement with substantially reduced disturbance of the charged particle beam caused by magnetic fields generated by the stage apparatus.

BACKGROUND

In many types of industrial processes, it is important that the workpiece be held and moved in an accurate and precise manner. This need is especially acute in microlithography, in which pattern transfer must be performed under extremely high demands of positioning accuracy and precision.

In microlithography, the pattern-defining reticle and a substrate usually are mounted on respective stages that achieve positioning of the substrate and reticle relative to each other sufficient to permit the pattern defined on the reticle to be transferred to the substrate. To ensure maximal flexibility in positioning measurement and control, many degrees of freedom of movement of the stage are desirable. In photolithography, for example, stages have been devised that include a table provided with three degrees of freedom of movement ($\theta_X$, $\theta_Y$, and Z directions), wherein the table is mounted on a stage that is movable in the X, Y, and $\theta_Z$ directions.

Photolithography systems do not include optical systems that dynamically correct the projected beam position. Hence, in photolithography systems, stage apparatus must be extremely accurate in their positioning ability and in their ability to synchronize motion with a second stage. To achieve such ends, a conventional stage apparatus for a photolithography system has a stacked two-level configuration as summarized above. Movements of the stage are performed by VCM (Lorentz-type "voice-coil motor") or EI core (electromagnetic) devices that utilize inexpensive electromagnetic power. These types of stage apparatus consume relatively low electrical power and have long service lives. Also, due to their simple configuration in which drive elements extend in respective linear directions, these types of stage apparatus are widely used in photolithography because they are relatively easy to control.

Stage apparatus conventionally used in photolithography, however, are not suitable for use in charged-particle-beam (CPB) microlithography systems. I.e, whenever a stage apparatus configured for use in photolithography is used in a CPB microlithography system, the following problems arise: (1) Since VCMs or electromagnets are used as drive means, as the stage is moved corresponding magnetic-field fluctuations are generated. These fluctuations cause minute deflections of the charged particle beam, which can have an adverse effect on the accuracy and precision of pattern transfer as achieved with the CPB microlithography system. (2) Use of magnetic and/or electrically conductive components in the stage and its drive mechanisms causes magnetic-field fluctuations as the stage is moved, which can have an adverse effect on the charged particle beam.

A conventional stage apparatus employs a biaxial air bearing for moving the stage in the X and Y directions. Such a stage apparatus is disclosed in Japan Kôkai Patent Publication No. Sho 62-182692, in which the stage apparatus includes multiple box-shaped air bearings. An oblique view of such a stage apparatus 140 is shown in FIG. 8. The stage apparatus 140 includes a base 141 to which two box-shaped base guides 142 are mounted. Each base guide 142 includes respective permanent-magnet plates mounted to the inner surfaces of the base guide 142, thereby forming a respective motor yoke 142a. Respective box-shaped coil bobbins 143 engage the respective "upper" (in the figure) portions of the base guides 142. Each combination of a motor yoke 142a and a coil bobbin 143 constitutes a respective linear motor that can be moved in the X-direction.

A box-shaped movable guide 144 extends between the two coil bobbins 143. A permanent magnet plate (not detailed) is mounted to the inner surface of the movable guide 144 to form a motor yoke 144a. A box-shaped coil bobbin 145 is engaged with the "upper" portion of the movable guide 144. The motor yoke 144a and coil bobbin 145 collectively constitute a linear motor providing movement in the Y-direction. A stage 146 is mounted to the coil bobbin 145. A substrate or reticle can be mounted to the stage 146.

Each coil bobbin 143, 145 includes air jets (not shown) defined in the respective inner surfaces thereof, facing the respective motor yokes 142a, 144a, thereby forming respective air bearings.

Whenever a stage apparatus as shown in FIG. 8 is used in a CPB microlithography system, the following problems may arise: (1) Since VCMs or electromagnets are used for actuating movement of the stage, moving the stage generates corresponding fluctuations in the magnetic field in the vicinity of the charged particle beam. These fluctuations adversely affect the charged particle beam, which decreases pattern-transfer accuracy and precision. (2) The stage apparatus 140 is configured such that X-Y movements involve respective movements along respective guides (coil bobbins 143 on base guides 142 for X-direction motion, and coil bobbin 145 on movable guide 144 for Y-direction motion) that are stacked relative to each other. Hence, to provide movement along the lower of these axes (in this instance the X-axis) a large and heavy movement mechanism must be employed.

Another conventional stage apparatus that provides motion in the X- and Y-directions comprises two uni-axial drives each configured in a respective "H" configuration. More specifically, the two uni-axial drives are arranged at 90° relative to each other. Such a configuration eliminates the need for respective permanent magnets on the "inner" surfaces of the movable guide 144. Also, in this configuration, the stage is freely movable in the Y-direction on the movable guide 144 instead of on the coil bobbin 145. But, two stages 145' must be provided, wherein one stage is rigidly mounted on top of the other. By placing the drive actuators at respective ends of the movable guide, the effects of magnetic fluctuations on the charged particle beam are minimized, with a corresponding improvement of pattern-transfer accuracy and precision. However, because the two stages are rigidly fixed to each other, their relative movements are too restricted. I.e., the operation of one stage is affected whenever the other stage is being actuated, which decreases the positioning-control accuracy of the stage apparatus. In addition, whenever two stages are rigidly fixed to each other in this manner, extremely high accuracy and precision must be applied during assembly of the stage apparatus.

SUMMARY

In view of the shortcomings of the prior art as summarized above, an object of the invention is to provide stage apparatus, for use in charged-particle-beam (CPB) microlithography apparatus, in which the stage table can be driven in multiple degrees of freedom with minimal magnetic disturbance to the charged particle beam, thereby improving the accuracy with which stage position can be controlled.

To such end, and according to a first aspect of the invention, stage apparatus are provided. An exemplary embodiment of a stage apparatus includes an XY stage that is movable and positionable within an XY plane defined by mutually perpendicular X- and Y-axes that are perpendicular to a Z-axis. The stage apparatus also includes a first table that is mounted to the XY stage and that is configured to be driven in a $\theta_Z$ drive direction about the Z-axis. The apparatus also includes a second table that is mounted to the first table and that is configured to be driven in a $\theta_X$ drive direction about the X-axis, a $\theta_Y$ drive direction about the Y-axis, and in a Z-axis drive direction. Thus, a stage apparatus is realized that provides multiple degrees of freedom of motion of the stage. Also, by disposing the various drive axes in separate tables, control of the stage and of the tables is made simpler without sacrificing accuracy and precision.

In this embodiment the XY stage can comprise respective X-axis and Y-axis linear motors configured to impart motion of the XY stage in the XY plane. The first and second tables can be connected together using multiple flexures, wherein the flexures are configured to prevent movement of the first and second tables relative to each other outside the drive directions.

The first and second tables and the XY stage desirably are connected together, at least in part, by actuators that are configured to drive the first and second plates and the XY stage in the respective drive directions. Also, the XY stage and actuators desirably are non-magnetic and non-conductive, especially if the stage apparatus is to be used in a charged-particle-beam system.

A stage apparatus according to another embodiment includes an XY stage that is movable and positionable within an XY plane. The apparatus also includes a first table that is mounted to the XY stage and that is configured to be driven in a $\theta_X$ drive direction about the X-axis, a $\theta_Y$ drive direction about the Y-axis, and in a Z-axis drive direction. The apparatus also includes a second table that is mounted to the first table and that is configured to be driven in a $\theta_Z$ drive direction about the Z-axis.

As in the first embodiment, the XY stage can include respective X-axis and Y-axis linear motors configured to impart motion of the XY stage in the XY plane. The stage apparatus also can include multiple flexures connecting the first and second plates together. Also, the first and second plates and the XY stage can be connected together, at least in part, by actuators that are configured to drive the first and second plates and the XY stage in the respective drive directions.

A stage apparatus according to yet another embodiment includes multiple stationary Y-axis guides that are parallel to each other and that extend in a Y-axis direction. A respective Y-axis slider is engaged with each stationary Y-axis guide. Each Y-axis slider is configured to slide in the Y-axis direction relative to the respective stationary Y-axis guide. A movable X-axis guide extends in an X-axis direction between the Y-axis sliders and connects the Y-axis sliders together. The apparatus includes an X-axis stage that is mounted to the movable X-axis guide and that is configured to slide in the X-axis direction along the movable X-axis guide. The apparatus includes multiple stationary X-axis guides that are parallel to each other and that extend in a X-axis direction. A respective X-axis slider is engaged with each stationary X-axis guide. Each X-axis slider is configured to slide in the X-axis direction relative to the respective stationary X-axis guide. A movable Y-axis guide extends in a Y-axis direction between the X-axis sliders and connects the X-axis sliders together. The stage apparatus also includes a Y-axis stage that is mounted to the movable Y-axis guide and that is configured to slide in the Y-axis direction along the movable Y-axis guide, wherein the X-axis stage and the Y-axis stage are connected together by multiple flexures that are rotatable within a plane perpendicular to the Z-axis. In this embodiment, since the X-axis stage and Y-axis stage are connected together by flexures, each of these stages can move smoothly without being restricted by the other stage, thereby improving the accuracy and precision of stage-positioning control.

According to another aspect of the invention, microlithography apparatus are provided that include a stage apparatus such as any of the embodiments summarized above.

The foregoing and additional features and advantages of the invention will be more readily apparent from the following detailed description, which proceeds with reference to the accompanying drawings.

DETAILED DESCRIPTION

The invention is described below in the context of representative embodiments, which are not intended to be limiting in any way. It will be understood that any of the various stage apparatus according to the invention are not limited to use in a charged-particle-beam (CPB) microlithography system (in which exposure occurs in a vacuum). The stage apparatus can be used in any of various applications, including environments that are not evacuated.

Electron-Beam Microlithography Apparatus

Figure 7:
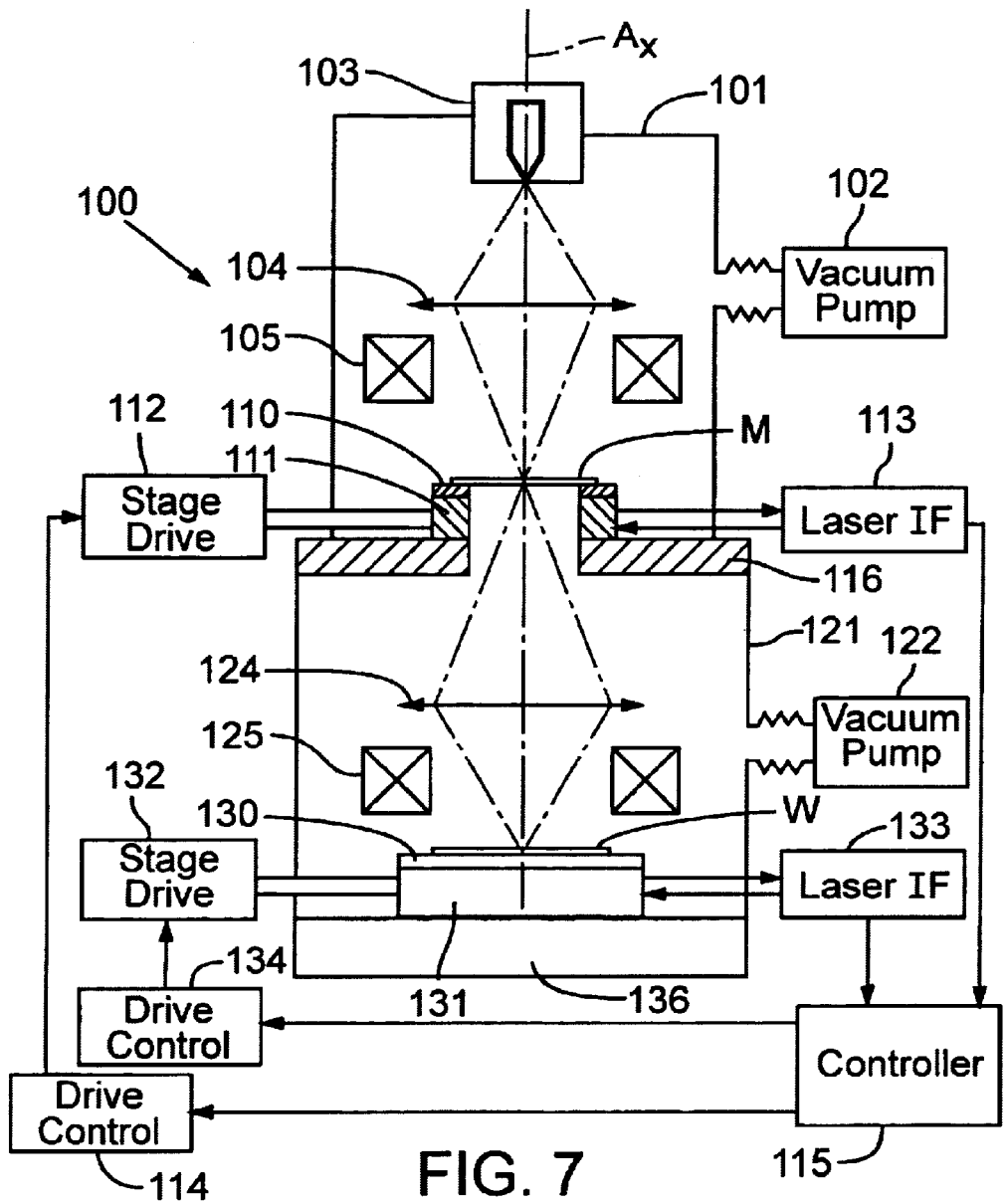
FIG. 7 is an elevational schematic diagram of a charged-particle-beam (specifically electron-beam) microlithography system including a stage apparatus according to the invention.
Figure 8:
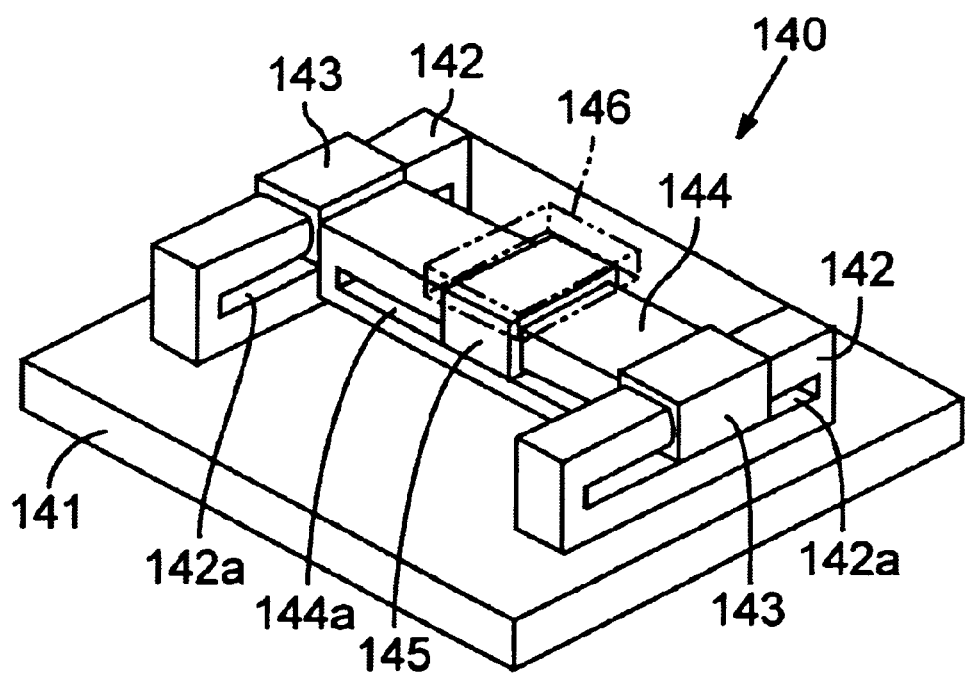
FIG. 8 is an oblique view of a conventional stage apparatus as disclosed in Japan Kôkai Patent Publication No. Sho 62-182692.

An electron-beam (as a representative charged particle beam) microlithography system 100 is shown in FIG. 7. The system of FIG. 7 comprises an electron-optical lens barrel 101 that is evacuated using a vacuum pump 102. The vacuum pump 102 maintains a desired vacuum level inside the lens barrel 101. Inside the lens barrel 101 is an electron gun 103 that emits an electron beam propagating in a downstream direction (vertically downward in the figure). The electron gun 103 is mounted at the "top" (in the figure) of the lens barrel 101. Disposed below the electron gun 103 along an optical axis Ax are a condenser lens 104, an electron-beam deflector 105, and a reticle M. The electron beam emitted from the electron gun 103 is converged by the condenser lens 104 to illuminate the reticle M. During illumination of the reticle M, respective exposure units (e.g., "subfields") of the reticle M that are within the field of the condenser lens 104 are sequentially scanned (in the horizontal direction in the figure) by action of the deflector 105 deflecting the electron beam. Thus, the subfields are sequentially illuminated for exposure.

The reticle M is fastened by electrostatic adhesion or the like to a chuck 110 that is mounted on an "upper" portion of a reticle stage 111. The reticle stage 111 is mounted on a base 116.

A stage drive 112 is connected to the reticle stage 111 and functions, when actuated, to move the reticle stage 111. The stage drive 112, in turn, is connected to a controller 115 via a drive control 114. The drive control 114 receives stage-drive commands from the controller 115 and converts those commands (e.g., digital-to-analog conversion) for use by the stage drive 112. Feedback control is achieved by a laser interferometer (IF) 113 that also is connected to the controller 115. The laser interferometer 113 produces highly accurate position data concerning the reticle stage 111, and the position data are input to the controller 115. Based on this data, stage-actuation commands are sent as required from the controller 115 to the drive control 114, which actuates the stage drive 112 to move the reticle stage 111 accordingly. Thus, the position of the reticle stage 111 is accurately controlled in real time.

A substrate chamber 121 is situated "below" the base 116. The substrate chamber 121 is evacuated to a suitable vacuum level by a vacuum pump 122. The substrate chamber 121 contains a condenser lens 124, a deflector 125, and a wafer W (as a suitable substrate). In the substrate chamber 121 the electron beam, having passed through the reticle M, is converged by the condenser lens 124 and deflected by the deflector 125 as required to form an image of the illuminated portion of the reticle at a desired location on the wafer W.

The wafer W is fastened by electrostatic adhesion to a chuck 130 disposed on the upstream-facing surface of the wafer stage 131. The wafer stage 131 is mounted on a base 136 and is connected to a respective stage drive 132. The stage drive 132 is connected to the controller 115 via a drive control 134. The stage drive 132 and drive control 134 function in a manner similar to the stage drive 112 and drive control 114, respectively. The position of the wafer stage 131 is accurately determined by a laser interferometer 133 that also is connected to the controller 115. Precise positioning information about the wafer stage 131, as measured by the laser interferometer 133, is input to the controller 115. The laser interferometer 133 provides feedback control of the position of the wafer stage 131 by routing data to the controller 115. Respective commands from the controller 115 are routed to the drive control 134 based on this information, which converts the commands as appropriate to actuate the stage drive 132. Thus, the position of the wafer stage 131 is accurately controlled in real time by feedback.

First Representative Embodiment of Stage Apparatus

Figure 2:
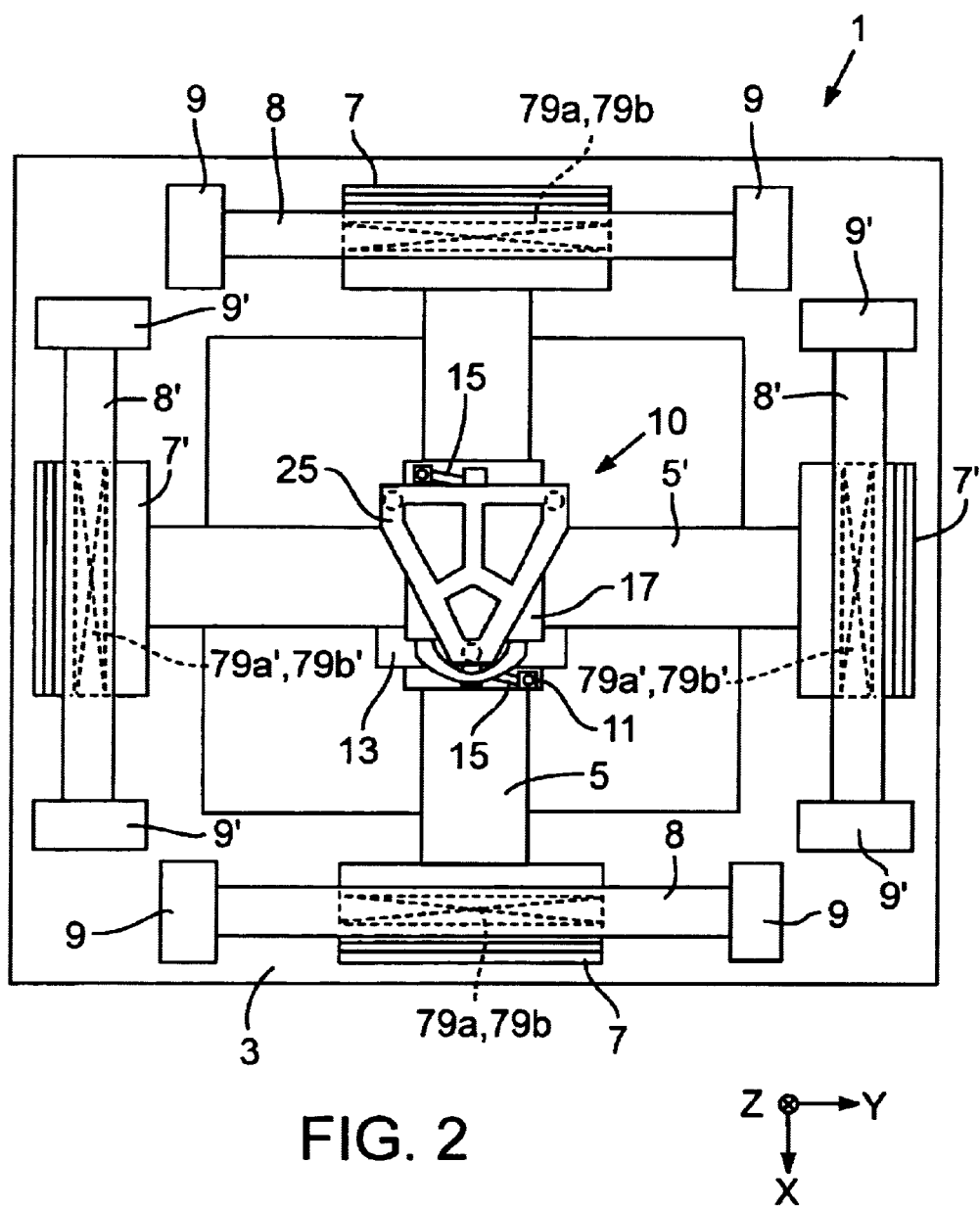
FIG. 2 is a plan view of the stage apparatus of the first representative embodiment.

Referring first to FIG. 2, a stage apparatus 1 according to this embodiment is mounted on a base 3. This stage apparatus 1 corresponds to, e.g., the wafer stage 131 of the microlithography system shown in FIG. 7. In FIG. 2 a stage assembly 10 is disposed at the center of the stage apparatus 1. The stage assembly 10 comprises a first stage 11 (shown as a "lower" stage) that is driven in the Y-axis direction by respective linear motors 79a, 79b, and a second stage 17 (shown as an "upper" stage) that is driven in the X-axis direction by respective linear motors 79a', 79b'.

The first stage 11 is provided with an air bearing (described below, referring to FIG. 5) that moves on a movable X-axis guide 5 that extends in the X-axis direction. Each end of the X-axis guide 5 includes a respective Y-axis slider 7 configured to slide in the Y-axis direction on a respective stationary Y-axis guide 8. To facilitate such sliding, each Y-axis slider 7 includes a respective air bearing (described below, referring to FIG. 5) that moves on the respective Y-axis guide 8. The Y-axis guides 8 are mounted to the base 3 by respective guide anchors 9 disposed at each end of the respective guide.

The second stage 17 is provided with an air bearing (described below, referring to FIG. 5) that moves on a movable Y-axis guide 5' that extends in the Y-axis direction. Each end of the Y-axis guide 5' includes a respective X-axis slider 7' configured to slide in the X-axis direction on a respective stationary X-axis guide 8'. To facilitate such sliding, each X-axis slider 7' includes a respective air bearing (described below, referring to FIG. 5) that moves on the respective X-axis guide 8'. The X-axis guides 8' are mounted to the base 3 by respective guide anchors 9' disposed at each end of the respective guide.

The linear motors 79a, 79b, 79a', 79b' are disposed, as described below, in the respective Y-axis sliders 7 and X-axis sliders 7'. Actuating the linear motors 79a, 79b causes movement of the Y-axis sliders 7 (with first stage 11) in the Y-axis direction relative to the Y-axis guides 8. Similarly, actuating the linear motors 79a', 79b' causes movement of the X-axis sliders 7' (with second stage) in the X-axis direction relative to the Y-axis guides 8'.

Figure 1:
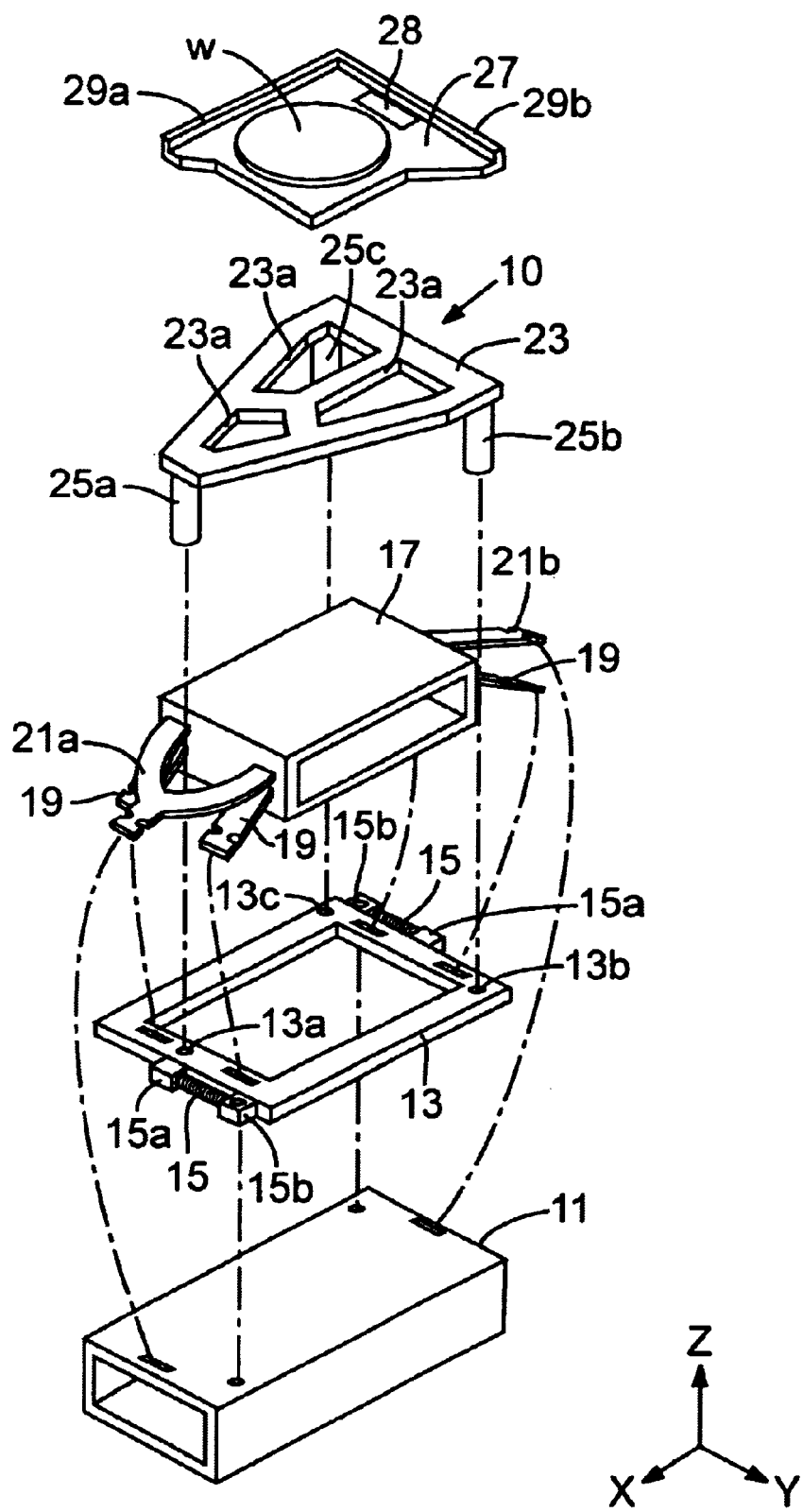
FIG. 1 is an oblique exploded view showing certain construction details of a stage apparatus according to a first representative embodiment.

Reference now is made to FIG. 1, which provides an exploded oblique view of the construction of the stage assembly 10. In the depicted embodiment, and along the Z-axis, the stage assembly 10 comprises the first ("lower") stage 11 that is movable in the Y-axis direction and the second ("upper") stage 17 that is movable in the X-axis direction. The stage assembly 10 also comprises a frame 13, desirably having a rectilinear configuration and that is rotatable in the $\theta_Z$ direction by piezo actuators 15. The stage assembly 10 also includes a table 23, desirably having an open triangular configuration, that is driven in the $\theta_X$, $\theta_Y$, and Z directions by piezo actuators 25a, 25b, 25c. A wafer table 27 is attached to the upstream-facing surface of the table 23, and a wafer W or other suitable substrate is mounted to the wafer table 27. The configuration shown in FIG. 1 is drivable with six degrees of freedom.

The first ("lower") stage 11 has an open-box configuration that facilitates sliding of the first stage 11 on the movable X-axis guide 5 in the X-axis direction (see FIG. 2). The frame 13 is mounted on the upstream-facing surface of the first stage 11. One piezo actuator 15 is disposed at each end, in the X-axis direction, of the frame 13. With respect to each piezo actuator 15, one end 15a is attached to the frame 13, and the other end is linked to the first stage 11 by a pin or the like to allow rotation of the piezo actuator relative to the first stage. The frame 13 thus can be rotated in the $\theta_Z$ direction by extending and contracting the piezo actuators 15 in a coordinated manner.

The second ("upper") stage 17 has an open-box configuration that facilitates sliding of the second stage 17 on the movable Y-axis guide 5' in the Y-axis direction. Two relatively short flexures 19 extend laterally from each end (in the X-axis direction) of the second stage 17. The "bottom" of the second stage 17 fits into a corresponding opening defined in the frame 13, wherein the flexures 19 are attached to the frame 13 in corresponding slots. The second stage 17 is sufficiently smaller than the opening in the frame 13 so that no mechanical interference occurs when the frame 13 is rotated in the $\theta_Z$ direction relative to the second stage 17. The flexures 19 deform only in the Y-axis direction. Consequently, the flexures 19 restrict movement of the frame 13 in the X-axis and Z-axis directions, but allow movement of the frame 13 in the $\theta_Z$ direction.

Relatively long flexures 21a, 21b are attached to each end (in the X-axis direction) of the second stage 17 "above" the short flexures 19. The flexure 21a extending in the positive X-axis direction is branched. The flexures 21a, 21b attach the second stage 17 to the first stage 11. By the flexures 21a, 21b, some tolerance is provided in the orthogonality of the second stage 17 relative to the first stage 11 (serving as a reference). In addition, the frame 13 provides some freedom of rotation relative to the first stage 11.

The table 23, desirably having a triangular configuration and having a defined thickness, is situated "above" the second stage 17. The table 23 defines three holes 23a that reduce the mass of the table 23. The table 23 is supported on piezo actuators 25a, 25b, 25c that extend from respective corners of the table 23 to respective locations on the frame 13. The piezo actuator 25a (disposed in the positive X-axis direction) passes between the branches of the flexure 21a and is attached at a location 13a as shown to the upstream-facing surface of the frame 13. The piezo actuators 25b, 25c (disposed in the negative X-axis direction) extend so as to flank both edges of the flexure 21b and are attached at respective locations 13b, 13c as shown to the upstream-facing surface of the frame 13.

The table 23 can be driven in the Z-axis direction by extending or contracting all the piezo actuators 25a, 25b, 25c equally in the Z-axis direction. The table 23 also can be driven in the $\theta_Y$ direction by extending or contracting the piezo actuator 25a and the piezo actuators 25b and 25c relative to each other. For instance, the table 23 can be driven in the positive $\theta_Y$ direction by extending the piezo actuators 25b and 25c while leaving the piezo actuator 25a fixed or in a contracted state. The table 23 can be driven in the $\theta_X$ direction by extending or contracting the piezo actuators 25b and 25c relative to one another. For instance, by extending the piezo actuator 25c while leaving the piezo actuator 25b fixed or in a contracted state, the table 23 can be driven in the negative $\theta_X$ direction. Thus, the three piezo actuators 25a, 25b, 25c are independently controllable, allowing a variety of controlled motions to be imparted to the table 23.

In this embodiment, the table 23 is triangular. However, it will be understood that the table 23 can have any of various other suitable configurations. In addition, although the table 23 is described as being movable with three degrees of freedom (as achieved using the three piezo actuators 25a, 25b, 25c), it will be understood that the table 23 can be configured as movable with fewer or more degrees of freedom of motion (e.g., six degrees of freedom) using fewer or more (e.g., six) piezo actuators, respectively.

The wafer table 27, on which the wafer W is mounted, is situated upstream of the table 23. The wafer table 27 normally includes a substrate-holding device such as an electrostatic chuck or the like (not shown, but see FIG. 7) situated on the upstream-facing surface of the wafer table 27. The wafer W is attached to the substrate-holding device. The wafer table 27 includes a mark plate 28 that defines marks used for determining the position of the wafer table 27 along the X-axis and Y-axis directions. The mark plate 28 desirably is situated to the side of the wafer W on the wafer table 27. Movable mirrors 29a, 29b are disposed at respective locations along respective edges of the wafer table 27. The outward-facing surfaces of the movable mirrors 29a, 29b are precision-polished and serve as corresponding reflective surfaces for the laser interferometer 133 shown in FIG. 7.

Figure 3:
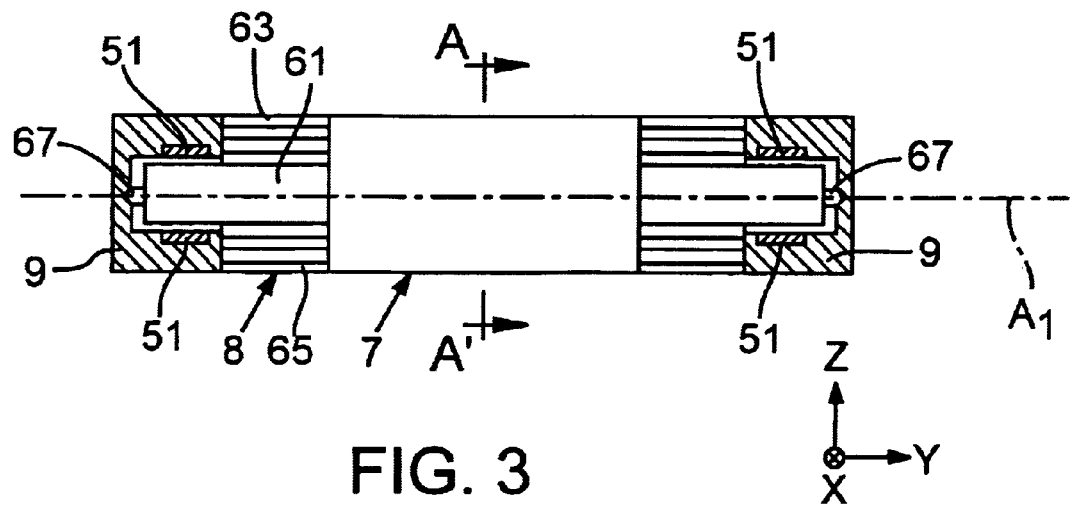
FIG. 3 is an elevational view (with partial sections) of a stationary guide of the stage apparatus of FIGS. 1 and 2.
Figure 4:
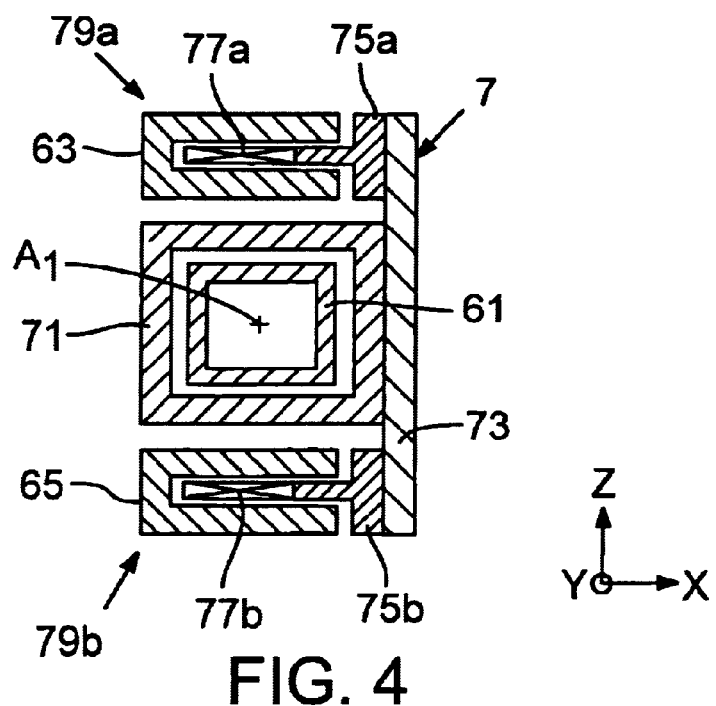
FIG. 4 is a section along the line A—A in FIG. 3.
Figure 5:
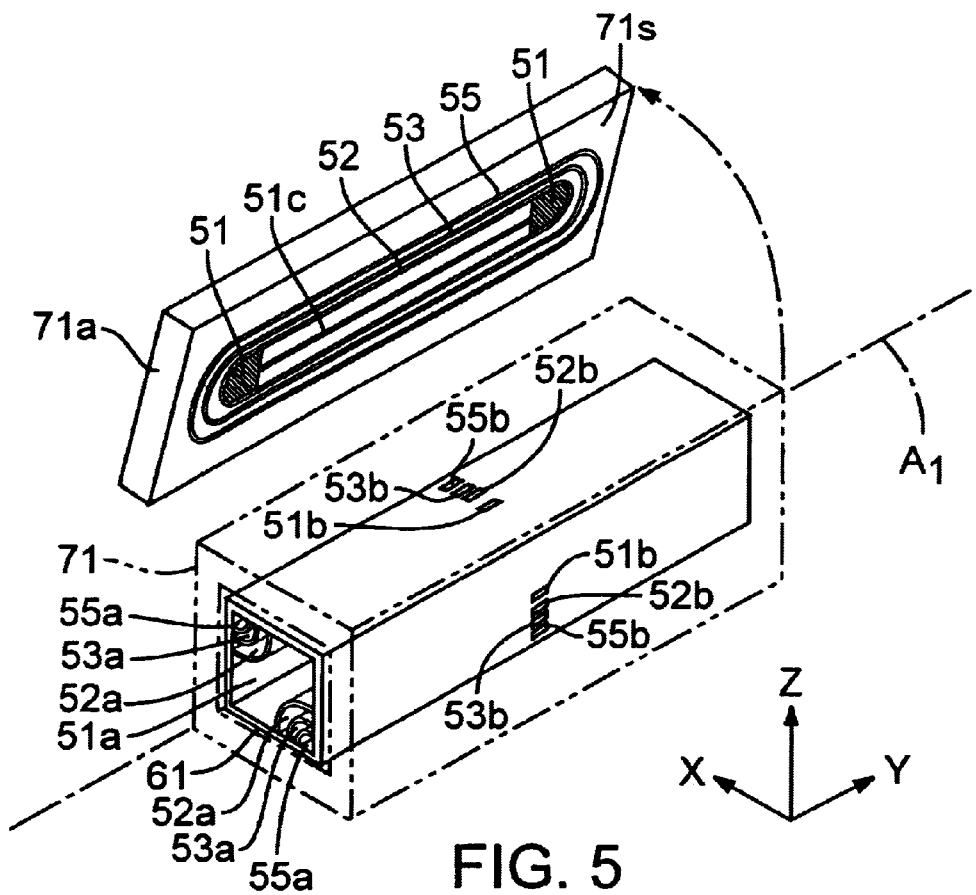
FIG. 5 is an oblique view of a slider of the stage apparatus of FIGS. 1 and 2, with one wall of the slider pivoted upward to reveal details of the air bearing.

Configurational details of a Y-axis slider 7 and respective Y-axis guide 8 are shown in FIGS. 3–5. It will be understood that each slider 7 and guide 8 and each slider 7' and guide 8' have similar structures to the illustrated structure. Note the axes shown in FIG. 3 relative to the axes shown in FIG. 2; FIG. 3 is a view in the negative X-axis direction of FIG. 2.

Referring first to FIG. 3, the Y-axis guide 8 comprises a tubular member 61. As shown in FIG. 4, the tubular member 61 has a square or rectangular transverse section. Each end of the tubular member 61 is attached to a respective guide anchor 9 via a bearing 67. A respective air pad (air bearing) 51 is disposed in each of the "top"- and "bottom"-contact surfaces between the respective guide anchor 9 and respective end of the tubular member 61. Around each air pad 51 in the guide anchor 9 is defined a groove and "guard ring" (not shown). The air pads 51 effectively sandwich the tubular member 61 from "above" and "below" (i.e., in the Z-axis direction) and thus serve to maintain alignment of the tubular member 61 and guide anchors 9 along the respective longitudinal axis $A_1$ of the tubular member 61. In the Z-axis direction, magnets 63, 65 are disposed "above" and "below" the tubular member 61. As shown in FIG. 4, each of the magnets 63, 65 has a squared-U-shaped configuration and extends longitudinally in the Y-axis direction, with the opening in the "U" facing away from the optical axis Ax.

The Y-axis slider 7 comprises a tubular member 71 having a square or rectangular transverse section (FIG. 4). The tubular member 61 of the Y-axis guide 8 extends coaxially through the tubular member 71 of the slider 7. Mounted to the tubular member 71 is a slider plate 73 having a specified thickness. T-shaped coil mounts 75a, 75b are mounted to the slider plate 73 and extend away from the slider plate 73 (leftward in the figure). Mounted to each coil mount 75a, 75b is a respective rectangular, flat-plate motor coil 77a, 77b. Each motor coil 77a, 77b extends into the respective U-shaped trough of the respective magnet 63, 65 to form a respective linear motor 79a, 79b, which (in the figure) achieve motion of the slider 7 in the Y-direction relative to the guide 8. Thus, the respective points of engagement of the driving force of the linear motors 79a, 79b are nearly aligned with the center of gravity of the Y-axis slider 7. By exerting the driving force on the center of gravity of the slider 7, high-precision and high-speed positional control of the Y-axis sliders 7 can be achieved.

Although not shown, it will be understood that electrical wiring is mounted as required to the slider 7 for delivering electrical power to the motor coils 77a, 77b. Also, tubing is mounted to the slider 7 for circulating coolant as required.

The Y-axis slider 7 does not actually contact the Y-axis guide 8; rather, air bearings are situated between the slider 7 and the guide 8. The construction of an exemplary air bearing is shown in FIG. 5, which depicts a tubular member 71 through which the tubular member 61 coaxially extends. In the figure, the "upper" wall 71a of the tubular member 71 is depicted pivoted upward to show underlying detail of the respective air bearing on a respective "bearing surface" 71s.

As noted above, the air bearing shown in FIG. 5 is exemplary of the various air bearings in a stage apparatus according to the invention. However, the structure of the air bearing is not limited to the specific configuration shown.

The depicted air bearing comprises two air pads 51, each comprising a respective unit of gas-porous material. The air pads 51 are situated at opposite ends of the bearing surface 71s of the upper wall 71a. An air-supply groove 51c is defined in the bearing surface 71s and extends linearly along the longitudinal median of the bearing surface 71s from one air pad 51 to the other. Surrounding the air-supply groove 51c and air pads 51 is an atmospheric-pressure guard "ring" (groove) 52 defined in the bearing surface 71s. The atmospheric-pressure guard ring 52 is connected to the external atmosphere to allow release of air from the atmospheric-pressure guard ring 52 to the atmosphere. Surrounding the atmospheric-pressure guard ring 52 is a "low-vacuum" guard ring (groove) 53 defined in the bearing surface 71s. The low-vacuum guard ring 53 is evacuated to a suitable "low-vacuum" level during operation of the air bearing. Surrounding the low-vacuum guard ring 53 is a "high-vacuum" guard ring (groove) 55 defined in the bearing surface 71s. The high-vacuum guard ring 55 is evacuated to a suitable "high-vacuum" level during operation of the air bearing. In the depicted desired configuration, the respective ends of the guard rings 52, 53, 55 have semicircular profiles, with linear portions extending parallel to the axis $A_1$ and connecting together the respective semicircular ends.

Respective conduits for supplying and circulating air to the air-supply groove 51c, atmospheric-pressure guard ring 52, and air pads 51, and for evacuating the vacuum guard rings 53, 55 extend along the inner surfaces of the tubular member 61. In a desired configuration as shown, high-vacuum exhaust conduits 55a extend lengthwise at the upper-left and lower-right of the section of the tubular member 61 shown in FIG. 5. Flanking the high-vacuum exhaust conduits 55a are respective low-vacuum exhaust conduits 53a. Thus, each of the low-vacuum exhaust conduits 53a has a semi-circular transverse profile. Flanking the low-vacuum exhaust conduits 53a are respective air-venting conduits 52a. Thus, each of the air-venting conduits 52a has a semi-circular transverse profile. The remaining space inside the tubular member 61 defines an air-supply conduit 51a that supplies air (or other suitable gas) to the air pads 51 via the air-supply groove 51c.

For making connections between the respective conduits 55a, 53a, 52a, 51a and the respective grooves 55, 53, 52, 51c, respective holes 55b, 53b, 52b, 51b are defined in the middle area in the sides of the cylinder guide 61 corresponding with the respective conduits 55a, 53a, 52a, 51a. As shown, each hole 55b, 53b, 52b, 51b is aligned with the respective groove 55, 53, 52, 51c to supply, circulate, and exhaust air. Since the longitudinal portions of each guard ring 52, 53, 55 and air-supply groove 51c are straight and extend parallel to the axis $A_1$, as the tubular member 71 moves relative to the tubular member 61 in the Y-axis direction, the holes 55b, 53b, 52b, 51b remain aligned and thus connected with their respective grooves 55, 53, 52, 51c. Thus, the grooves 55, 53, 52, 51c are constantly supplied with air, vented, or evacuated as appropriate.

Air is supplied from the air-supply conduit 51a to the air-supply groove 51c and discharged through the porous material of the air pads 51 into the air bearing. This discharged air is collected in the atmospheric-pressure guard ring 52, conducted from the guard ring 52 to the air-venting conduit 52a, and discharged to the atmosphere. Air leaking from the atmospheric-pressure guard ring 52 is collected in the low-vacuum guard ring 53 and evacuated through the low-vacuum exhaust conduit 53a. Any remaining air is collected in the high-vacuum guard ring 55 and evacuated through the high-vacuum conduit 55a. As a result of this coordinated functioning of the guard rings, virtually no air leaks from the air pads into the substrate chamber 121, which is maintained at a high vacuum.

As noted above, each movable guide 5, 5' has associated therewith a respective slider 7, 7' on each end. With respect to each movable guide 5, 5', one slider 7, 7' has a respective air bearing situated on each of the "top," "bottom," and sides of the slider. The other slider 7, 7' has a respective air bearing situated only on the "top" and "bottom" surfaces of the slider. Thus, the movable guides 5, 5' and stages 11, 17 are movable in the X-axis, Y-axis, and Z-axis directions while employing a minimal number of air pads.

In this and other embodiments, it is desirable that the first and second stages and as many of the other components as possible be made of non-magnetic and electrically non-conductive materials, especially if the stage apparatus is to be used in a charged-particle-beam system. These types of materials substantially reduce the probability of generating unwanted magnetic fields in the vicinity of the charged particle beam. Exemplary materials include any of various ceramics, aluminum alloys, and titanium alloys.

It also is desirable that the actuators in this and other embodiments be non-magnetic and have minimal electrical conductivity, especially if the stage apparatus is to be used in a charged-particle-beam system. In this embodiment, the actuators 15 and 25a–25c are described as being piezo actuators (electrostrictive actuators), which are the preferred type of actuators if the stage apparatus is to be used with a charged-particle-beam system. Alternatively, any of various other types of actuators can be used such as ultrasonic, mechanical, and hydraulic/pneumatic actuators. Also, if the generation of stray magnetic fields is not of serious concern, the actuators can be electromagnetic (e.g., Lorentz-type, EI core, etc.) or magnetostrictive. As noted above, in a charged-particle-beam system that must operate under conditions of substantially no stray magnetic fields, high vacuum (low-emission), high controllability (linearity), and extreme accuracy and precision (servo characteristics), electrostrictive (piezo) actuators are especially desired.

Second Representative Embodiment of Stage Apparatus

Figure 6:
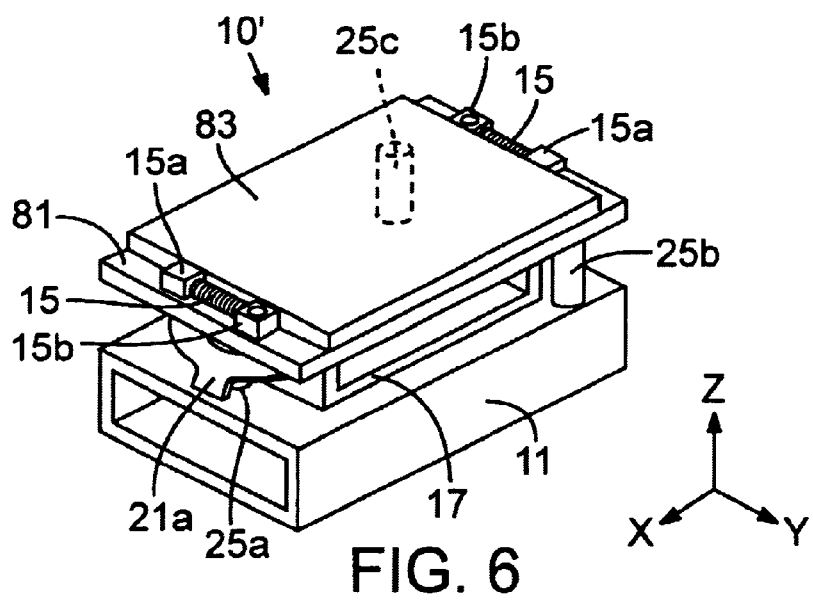
FIG. 6 is an oblique view of a stage apparatus according to a second representative embodiment.

A second representative embodiment of a stage assembly 10' is shown in FIG. 6. The stage assembly 10' comprises a first ("lower") stage 11 and a second ("upper") stage 17. Attached to each of two opposing ends (in the X-axis direction) of the second stage 17 are relatively long respective flexures 21a, 21b. The long flexure 21a attached to the surface of the second stage 17 facing in the positive X-axis direction is branched as shown. The second stage 17 is attached to the first stage 11 by the relatively long flexures 21a, 21b.

A "lower" plate 81 (desirably rectangular in shape and having a specified thickness) is disposed "above" the second stage 17. Three piezo actuators 25a, 25b, 25c are disposed extending from the "lower" surface of the "lower" plate 81 to the first stage 11. The piezo actuator 25a extends between the branches of the flexure 21a from the "lower" plate 81 to the "upper" surface of the first stage 11. The piezo actuators 25b, 25c extend on respective sides of the flexure 21b from the "lower" plate 81 to the "upper" surface of the first stage 11.

The "lower" plate 81 can be driven in the Z direction by extending or contracting the piezo actuators 25a, 25b, 25c equally. The "lower" plate 81 can be driven in the $\theta_Y$ direction by extending or contracting the piezo actuator 25a relative to the piezo actuators 25b, 25c. The "lower" plate 81 can be driven in the $\theta_X$ direction by extending or contracting the piezo actuators 25b and 25c relative to each other.

An "upper" plate 83 (desirably having a rectangular profile and a specified thickness) is disposed "above" the "lower" plate 81. A respective piezo actuator 15 is disposed at each end (in the X-axis direction) of the "upper" plate 83. One end 15a of each piezo actuator 15 is attached to the "upper" plate 83. The other end of each piezo actuator 15 is linked to the "lower" plate 81 by a pin or the like allowing rotation of the piezo actuator relative to the plate 81. The "upper" plate 83 thus can be rotated in the $\theta_Z$ direction by extending and contracting the piezo actuators 15. A wafer table or the like is mounted on the "upper" plate 83.

As is understood from the foregoing description, stage apparatus are provided that comprise a table that can be driven with multiple degrees of freedom of motion without disturbing neighboring magnetic fields, thereby improving the accuracy and precision of a charged-particle-beam process being conducted on a substrate held by the table.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A stage apparatus for moving and positioning a stage within an XY plane defined by mutually perpendicular X- and Y-axes that are perpendicular to a Z-axis, the stage apparatus comprising:

multiple stationary Y-axis guides that are parallel to each other and that extend in a Y-axis direction;

a respective Y-axis slider engaged with each stationary Y-axis guide, each Y-axis slider being configured to slide in the Y-axis direction relative to the respective stationary Y-axis guide;

a movable X-axis guide extending in an X-axis direction between the Y-axis sliders and connecting the Y-axis sliders together;

an X-axis stage mounted to the movable X-axis guide and configured to slide in the X-axis direction along the movable X-axis guide;

multiple stationary X-axis guides that are parallel to each other and that extend in the X-axis direction;

a respective X-axis slider engaged with each stationary X-axis guide, each X-axis slider being configured to slide in the X-axis direction relative to the respective stationary X-axis guide;

a movable Y-axis guide extending in a Y-axis direction between the X-axis sliders and connecting the X-axis sliders together; and a Y-axis stage mounted to the movable Y-axis guide and configured to slide in the Y-axis direction along the movable Y-axis guide, wherein the X-axis stage and the Y-axis stage are connected together by at least one flexure that allows limited rotation, and thus provides a tolerance in orthogonality, of the X-axis stage and Y-axis stage relative to each other within a plane perpendicular to the Z-axis.

2. The stage apparatus of claim 1, wherein each of the X-axis sliders and each of the Y-axis sliders comprises a respective linear motor configured to impart motion of the X-axis and Y-axis stages in the XY plane.

3. A microlithography apparatus, comprising the stage apparatus of claim 1.

4. The stage apparatus of clam 1, further comprising a frame attached to and displaceable relative to one of the X-axis and Y-axis stages.

5. The stage apparatus of claim 4, wherein the frame is connected to the one of the X-axis and Y-axis stages by at least one actuator situated and configured to rotate the frame relative to the one of the X-axis and Y-axis stages.

6. The stage apparatus of 4, further comprising a table mounted to the frame, wherein the table is displaceable relative to the X-axis and Y-axis stages.

7. The stage apparatus of claim 6, further comprising at least one actuator extending between the frame and the table, the actuator providing the table with at least one degree of freedom of displaceability relative to the frame.

8. The stage apparatus of 6, wherein the table is displaceable relative to the frame in at least three degrees of freedom of motion.

9. The stage apparatus of claim 8, wherein the table is displaceable in a $\theta_X$-direction, a $\theta_Y$-direction, and a Z-direction relative to the frame.

10. The stage apparatus of claim 6, further comprising an object-holding device mounted to the table.

11. The stage apparatus of claim 10, wherein the object-holding device is a wafer table.

12. The stage apparatus of claim 1, further comprising a table attached to and displaceable relative to one of the X-axis and Y-axis stages.

13. The stage apparatus of claim 12, wherein the table is displaceable in a $\theta_X$-direction, a $\theta_X$-direction, and a Z-direction relative to one of the X-axis and Y-axis stages.

14. The stage apparatus of claim 12, further comprising a frame attached to and displaceable relative to the table in a $\theta_Z$-direction.

15. The stage apparatus of claim 14, further comprising an object-holding device mounted to the frame.

16. The stage apparatus of claim 15, wherein the object-holding device is a wafer stage.

* * * * *

UNITED STATES PATENT AND TRADEMARK OFFICE
CERTIFICATE OF CORRECTION

PATENT NO. : 6,693,284 B2
DATED : February 17, 2004
INVENTOR(S) : Tanaka

It is certified that error appears in the above-identified patent and that said Letters Patent is hereby corrected as shown below:

Column 2,
Line 27, "144aand" should read -- 144a and --.

Column 12,
Line 45, "in a $\theta_x$-direction, a $\theta_x$-direction, and" should read -- in a $\theta_x$-direction, a $\theta_y$-direction, and --.

Signed and Sealed this

Fifteenth Day of February, 2005

JON W. DUDAS
*Director of the United States Patent and Trademark Office*